United States Patent
Lee et al.

(10) Patent No.: US 6,515,910 B1
(45) Date of Patent: Feb. 4, 2003

(54) BIT-BY-BIT $V_T$-CORRECTION OPERATION FOR NONVOLATILE SEMICONDUCTOR ONE-TRANSISTOR CELL, NOR-TYPE FLASH EEPROM

(75) Inventors: Peter W. Lee, Saratoga, CA (US); Hsing-Ya Tsao, San Jose, CA (US); Tam Tran, San Jose, CA (US); Fu-Chang Hsu, San Jose, CA (US)

(73) Assignee: Aplus Flash Technology Inc., San Jose, CA (US)

( * ) Notice: Subject to any disclaimer, the term of this patent is extended or adjusted under 35 U.S.C. 154(b) by 0 days.

(21) Appl. No.: 10/076,826

(22) Filed: Feb. 15, 2002

Related U.S. Application Data
(60) Provisional application No. 60/273,585, filed on Mar. 6, 2001.

(51) Int. Cl.[7] .............................................. G11C 16/06
(52) U.S. Cl. ......................... 365/185.22; 365/185.29; 365/185.3; 365/185.09
(58) Field of Search ....................... 365/185.22, 185.29, 365/185.3, 185.09

(56) References Cited

U.S. PATENT DOCUMENTS

| | | | |
|---|---|---|---|
| 5,237,535 A | 8/1993 | Mielke et al. ............... | 365/218 |
| 5,748,538 A | 5/1998 | Lee et al. ............... | 365/185.06 |
| 5,822,252 A | 10/1998 | Lee et al. ................. | 365/185.3 |
| 5,848,000 A | 12/1998 | Lee et al. ............... | 365/185.23 |
| 5,856,944 A | * 1/1999 | Prickett et al. ......... | 365/185.29 |
| 5,940,325 A | * 8/1999 | Chang et al. ........... | 365/185.28 |
| 5,953,255 A | * 9/1999 | Lee .......................... | 365/185.3 |
| 6,055,190 A | * 4/2000 | Lu et al. ................. | 365/185.22 |
| 6,122,198 A | 9/2000 | Haddad et al. ......... | 365/185.22 |

* cited by examiner

Primary Examiner—Huan Hoang
(74) Attorney, Agent, or Firm—George O. Saile; Stephen B. Ackerman

(57) ABSTRACT

A method to test the erase condition of memory cells in a memory array device is achieved. The method is further extended to methods to detect and correct under erase and over erase conditions. The erase condition of a section of the memory array device is altered to form an erased section and non-erased sections. The control gates of the memory cells in the non-erased sections are forced to a normal off-state voltage sufficient to turn off erased cells. The control gates of the memory cells in non-selected subsections of the erased section are forced to a guaranteed off-state voltage that will turn off erased cells including those that are over erased. The control gates of the memory cells in a selected subsection of the erased section are forced to a check voltage. Thereafter, the bitline current of the selected subsection of the erased section is measured to determine erase condition of the selected subsection of the erase section.

25 Claims, 15 Drawing Sheets

|  |  | Erase | Erase Verify* | Erase Inhibit | Correction Verify* | Correction*** |
|---|---|---|---|---|---|---|
| Block 0 (selected) | BLn | 0V | 0V | 0V | 0V | 0V |
|  | BLn+1 | 0V | +1V | 0V | +1V | +5V |
|  | BT1(0) | 0V | 0V | 0V | 0V | 0V |
|  | WL0(0) | -10V | Versvfy | -10V | 0V | 0V |
|  | SL0(0) | +5V | 0V | +5V | 0V | 0V |
|  | WL1(0) | -10V | -4V | -10V | Vcorvfy | Vcorr |
|  | WL2(0) | -10V | -4V | -10V | -4V | -4V |
|  | SLm(0) | +5V | 0V | 0V | 0V | 0V |
|  | WL511(0) | -10V | -4V | 0V | -4V | -4V |
|  | BT2(0) | 0V | Vdd | 0V | Vdd | +10V |
| Block n (non-selected) | BT1(n) | 0V | 0V | 0V | 0V | 0V |
|  | WL0(n) | 0V | 0V | 0V | 0V | 0V |
|  | SL0(n) | 0V | 0V | 0V | 0V | 0V |
|  | WL1(n) | 0V | 0V | 0V | 0V | 0V |
|  | WL2(n) | 0V | 0V | 0V | 0V | 0V |
|  | SLm(n) | 0V | 0V | 0V | 0V | 0V |
|  | WL511(n) | 0V | 0V | 0V | 0V | 0V |
|  | BT2(n) | 0V | 0V | 0V | 0V | 0V |

Note: * M3 is selected
\*\* M12, M13, M14 and M15 are selected
\*\*\* M7 is selected; M0, M1, M2 and M3 pass the verification of correction

FIG. 6

|  |  | Erase | Erase Verify* | Erase Inhibit** | Correction Verify* | Correction*** |
|---|---|---|---|---|---|---|
| Block 0 (selected) | BLm | 0V | +1V | 0V | +1V | 0V |
|  | BLm+1 | 0V | +1V | 0V | +1V | +5V |
|  | BLm+2 | 0V | +1V | 0V | +1V | 0V |
|  | BLm+3 | 0V | +1V | 0V | +1V | +5V |
|  | BT1(0) | Vdd | Vdd | Vdd | Vdd | +10V |
|  | WL0(0) | -15V | Versvfy | -15V | Vcorvfy | Vcorr |
|  | WL1(0) | -15V | -4V | -15V | -4V | +2.5V |
|  | WL31(0) | -15V | -4V | 0V | -4V | +2.5V |
|  | SL(0) | 0V | 0V | 0V | 0V | 0V |
|  | ST1(0) | Vdd | Vdd | Vdd | Vdd | 0V |
| Block n (non-selected) | BT1(n) | 0V | 0V | 0V | 0V | 0V |
|  | WL0(n) | 0V | 0V | 0V | 0V | 0V |
|  | WL1(n) | 0V | 0V | 0V | 0V | 0V |
|  | WL31(n) | 0V | 0V | 0V | 0V | 0V |
|  | SL(n) | 0V | 0V | 0V | 0V | 0V |
|  | ST1(n) | 0V | 0V | 0V | 0V | 0V |

Note: * Ma, Mb, Mc and Md are selected
\*\* Mi, Mj, Mk and Ml are selected
\*\*\* Mb and Md are correction inhibit
Ma and Mc are corrected

FIG. 11

BIT-BY-BIT $V_T$-CORRECTION OPERATION FOR NONVOLATILE SEMICONDUCTOR ONE-TRANSISTOR CELL, NOR-TYPE FLASH EEPROM

The instant application claims priority to U.S. Provisional Application Ser. No. 60/273,585, field Mar. 6, 2001, which is herein incorporated by reference.

BACKGROUND OF THE INVENTION

(1) Field of the Invention

The invention relates to a method to erase memory cells in a memory device, such as an array of Flash EPROM or EEPROM memory cells. More particularly, the invention relates to a method to erase, erase verify, erase inhibit, and over erase correct, and over erase verify memory cells in a memory device.

(2) Description of the Prior Art

A typical Flash memory device has a memory array comprising a plurality of memory cells arranged in rows (wordlines) and columns (bitlines). Circuits in the device control operations performed on the array, such as erasing, programming, reading, and verification. Each cell in the array comprises some type of floating gate, or adjustable threshold voltage ($V_t$), device. Typically, the drain of each cell is coupled to a column that is further coupled to a bitline decoder. The source of each cell is coupled to a global source line. The control gate of each cell is coupled to a row that is further coupled to a wordline decoder. The bitline and wordline decoder circuits perform the operations of selecting cells and providing proper voltage biases during the various array operations.

During programming, for instance, a programming voltage, VPP, of typically about 10 Volts is transferred to a selected row, or wordline. At the same time, the column, or bitline is biased to about 5 Volts, while the global source line is biased to about 0 Volts. In this condition, the floating gate of the memory cell will be charged and the threshold voltage, $V_t$, will be increased. Typically, this translates to a "0" state for the cell. Finally, programming operations are typically performed on a bit-by-bit (or cell-by-cell) basis.

Erasing operations are typically performed on blocks of cells within the array, or on the entire array, at one time. To erase the cells, an erasing voltage, sometimes called VNN, is applied to all of the rows, or wordlines, in the block being erased. For example, the VNN voltage may be about −10 Volts. At the same time, about 5 Volts is applied to the global source line. The columns, or bitlines, are left floating. Typically, the wordline and source line voltages are pulsed. During the erasing operation, charge is removed from the floating gate to thereby decrease $V_t$. The erased state is typically designated the "1" state for the cell.

Following the erasing operation, an erase verify is performed to detect any under erased cells that have $V_t$ above the allowable maximum $V_t$, called $V_{tmax}$, for a cell to still be considered erased. For example, $V_{tmax}$ may have a value of about 1.5 Volts. If an under erased cell is detected, then another erase operation must be performed. However, other erased cells, that were previously not under erased, may become over erased due to the repeated erase pulses. An over erased cell has a $V_t$ that is below an allowable, minimum $V_t$, called $V_{tmin}$, and is typically in the on-state, even with a control gate voltage of about 0 Volts. Over erased cells are not desirable since they conduct and cause bitline leakage. Therefore, the over erased cells can cause erroneous data reads and verification. Further, the over erased cells may overload the bitline power supply during programming or correction.

Referring now to FIG. 1, a prior art Flash memory array is illustrated. A simplified electrical schematic diagram of a column 500 of Flash EEPROM cells 502, 504, 506, and 508, is shown. In this example, one cell 504 is being programmed. Therefore, the control gate of this cell 504 is biased to the programming voltage, VPP. The bitline, BL, is biased to 5 Volts. The global source, VS, is biased to 0 Volts. Meanwhile, the control gates of the other cells 502, 506, and 508, are biased to ground. In this configuration, the expected bitline current, $I_{BL}$, is equal to $I_2$. None of the other cells, 502, 506, and 508, should contribute any current since each cell should be in the off-state. However, if one or more of the other cells is in an over erased state, then gate voltage of 0 Volts is not sufficient to insure that the cell is OFF since its $V_t$ may be very low, zero, or even negative. Therefore, in the case where all the other cells 502, 506, and 508, are over erased, the bitline current, IBL, is equal to the sum of all the currents, $I_1$, $I_2$, $I_3$, and $I_4$. In a typical Flash EEPROM device, the drains of many of memory transistors cells are connected to each bitline. As many as 512 cells may be connected in to each bitline. The undesirable leakage current may exceed the capability of the power supply from the internal pump circuit during a programming or a correction operation. In the case of many over erased cells in a column, it would be impossible to program or correct the memory cells to the right state. The memory is inoperative.

Referring now to FIG. 2, the prior art Flash memory array is again shown. In this example, memory cell 704 is being checked for an over erase condition. Therefore, the control gates of the other memory cells 702, 706, and 708, are biased to ground. The selected cell 704 is biased to the over erase check voltage. Once again, it is assumed that the grounded-gate devices will not conduct. Therefore, the bitline current, $I_{BL}$, should equal $I_2$. However, if the non-selected cells are over erased to the point of a very low, or even negative, $V_t$, then these cells will conduct current. The bitline current, $I_{BL}$, will then be the sum of all the cell currents. This will cause an erroneous read. It will not be possible to tell if the selected cell 704 is, or is not, over erased. Similarly, the presence of over erased cells can cause an under erase check to give false results.

Referring now to FIG. 3, a prior art over erase detection and correction method is illustrated. However, this method does not address the problems illustrated in FIGS. 2 and 3, and may fail to identify both over erased cells and under erased cells. Because over erased cells may be present during an erase or an erase verify, under erased cells and over erased cells may not be properly identified and may be present after the entire erase method is finished.

Referring now to FIGS. 4A through 4C, another prior art method is shown. In this method, bit-by-bit erase verify, erase, bit-by-bit over erase verify, and over erase correction are performed. According to FIG. 4A, after each erase operation, an erase verify is conducted starting from the first cell 402 and 404 and ending at the last cell 412 and 416. If an under erased bit is detected in step 408, then an erase operation is repeated in step 409. The bit is then erase verified again until it passes. After erase verification of all cells, the method passes to an over erase detection and correction method in FIG. 4B. Again, the verification is performed on all cells, from the first cell 418 and 420 to the last cell 430 and 434. If any over erased bit is detected in step 424, then an over erase correction is performed in step 426. The cell is then over erase verified again. After the over erase verification is performed, the entire array is erase verified again in FIG. 4C. Once again, the method parses the entire array to detect any under erased cells. Even though FIGS. 4A through 4C show an elaborate scheme, the method may not accurately detect all of the under erased or over erased cells. During the verification checks, this method applies ground to the non-selected rows, or wordlines, including those in the erased block. As shown in FIGS. 1 and 2, however, this may not be sufficient to insure that over erased cells do not interfere with the bitline current measurement. As a result, under erased cells may be misidentified as properly erased cells. Further, during an over erase correction, the over erased, non-selected cells on a common bitline with an addressed cell can cause a false over erase detection.

Several prior art inventions describe Flash memory erase, verification, and correction methods. U.S. Pat. No. 5,237,535 to Mielke et al teaches the method to repair over erased cells in a Flash memory as shown in the above-referenced prior art FIG. 3. U.S. Pat. No. 6,122,198 to Haddad et al shows a method to erase, bit-by-bit erase verify, over erase verify, and over erase correct, as shown in above-referenced, FIGS. 4A through 4C.

U.S. Pat. Nos. 5,748,538, 5,848,000, and 5,822,252, all to Lee et al, describe Flash memory architectures and methods of over erase repair. Particularly, U.S. Pat. No. 5,848,000 discloses a flash memory address decoder circuit with a novel latch structure. Three levels of wordline voltages are driven using the unique architecture. Further, U.S. Pat. No. 5,822,252, entitled, "Flash Memory Wordline Decoder with Over erase Repair," issued Oct. 13, 1998, discloses the use of a negative voltage on a non-selected wordline. This patent is assigned to the same assignee as the present invention and is incorporated herein by reference in its entirety.

SUMMARY OF THE INVENTION

A principal object of the present invention is to provide an effective method to erase a memory array.

A further object of the present invention is to provide a method to check the erase condition of memory cells of a memory array.

A still further object of the present invention is to provide a method to check the erase condition of erase cells using a novel, three voltage level wordline, or control gate, scheme.

Another still further object of the present invention is to provide a method to check the erase condition where a guaranteed off-state voltage is used to guarantee that even over erased cells are in the off-state during under erase and over erase check.

Another further object of the present invention is to provide a method to verify and correct under erased memory cells in a memory array.

Another still further object of the present invention is to provide a method to verify and correct under erased memory cells where cells are selectively re-erased if an under erase condition is detected.

Another further object of the present invention is to provide a method to detect and correct over erased memory cells in a memory array.

Another still further object of the present invention is to provide a method to detect and correct over erased memory cells where cells are selectively pulsed with a correction voltage if an over erase condition is detected.

In accordance with the objects of the present invention, a method to check the erase condition of memory cells in a memory array device is achieved. The erase condition of a section of the memory array device is altered to form an erased section and non-erased sections. The control gates of the memory cells in the non-erased sections are forced to a normal off-state voltage sufficient to turn off erased cells. The control gates of the memory cells in non-selected subsections of the erased section are forced to a guaranteed off-state voltage that will turn off erased cells including those that are over erased. The control gates of the memory cells in a selected subsection of the erased section are forced to a check voltage. Thereafter, the bitline current of the selected subsection of the erased section is measured to determine the erase condition of the selected subsection of the erased section.

Also in accordance with the objects of the present invention, a method to detect and correct an over erase condition in memory cells in a memory array device is achieved. A section of the memory array device is erased to form an erased section and non-erased sections. Subsequent erasing of all subsections of the erased section is enabled. A starting memory address is set to thereby select a subsection of the erased section. Thereafter, under erased memory cells in the selected subsection of the erased section are detected. The detecting comprises, first, forcing control gates of the memory cells in the non-erased sections to a normal off-state voltage sufficient to turn off erased cells. The control gates of the memory cells in non-selected subsections of the erased section are forced to a guaranteed off-state voltage that will turn off erased cells including those that are over erased. The control gates of the memory cells in a selected subsection of the erased section are forced to an under erase check voltage. Thereafter, the bitline current of the selected subsection of the erased section is measured to determine the under erase condition of the selected subsection of the erase section, and the subsequent erasing of the selected subsection of the erased section is disabled if the under erase condition does not exist. Thereafter, the memory address is incremented to the next memory address to thereby select a new selected subsection of the erased section. Finally, the steps for detecting under erased memory cells are repeated until every subsection of the erased section is detected. Thereafter, the under erased cell is corrected by erasing the subsections of the erased section wherein the subsequent erasing remains enabled.

Also in accordance with the objects of the present invention, a method to detect and correct an over erase condition in memory cells in a memory array device is achieved. A section of the memory array device is erased to form an erased section and non-erased sections. A starting memory address is set to thereby select a subsection of the erased section. Thereafter, over erased memory cells in the selected subsection of the erased section are detected and corrected. The detecting and correcting comprises, first, forcing control gates of the memory cells in the non-erased sections to a normal off-state voltage sufficient to turn off erased cells. The control gates of the memory cells in non-selected subsections of the erased section are forced to a guaranteed off-state voltage that will turn off erased cells including those that are over erased. The control gates of the memory cells in a selected subsection of the erased section are forced to an over erased check voltage. Thereafter, the bitline current of the selected subsection of the erased section is measured to determine the over erase condition of the selected subsection of the erase section, and a correction voltage is pulsed on the control gates of the memory cells of the selected subsection of the erased section if an over erase condition exists. Thereafter, the memory address is incremented to the next memory address to thereby select a new selected subsection of the erased section. Finally, the steps are repeated until every subsection of the erased section is over erase detected and corrected.

BRIEF DESCRIPTION OF THE DRAWINGS

In the accompanying drawings forming a material part of this description, there is shown:

FIG. 6 illustrates a bias condition table for wordlines, bitlines, and source lines, for the ETOX NOR Flash array of FIG. 5, exhibiting different operation, such as erase, erase verify, erase inhibit, correction verify, and correction.

FIG. 11 illustrates a bias condition table for wordlines, bitlines, and source lines, for the AND Flash array of FIG. 10, exhibiting different operation, such as erase, erase verify, erase inhibit, correction verify, and correction.

DESCRIPTION OF THE PREFERRED EMBODIMENTS

The preferred embodiments disclose a novel method to erase an MTP Flash memory device. In the preferred embodiments, methods to accurately detect and correct under erase and over erase conditions are disclosed. It should be clear to those experienced in the art that the present invention can be applied and extended without deviating from the scope of the present invention.

Figure 1:
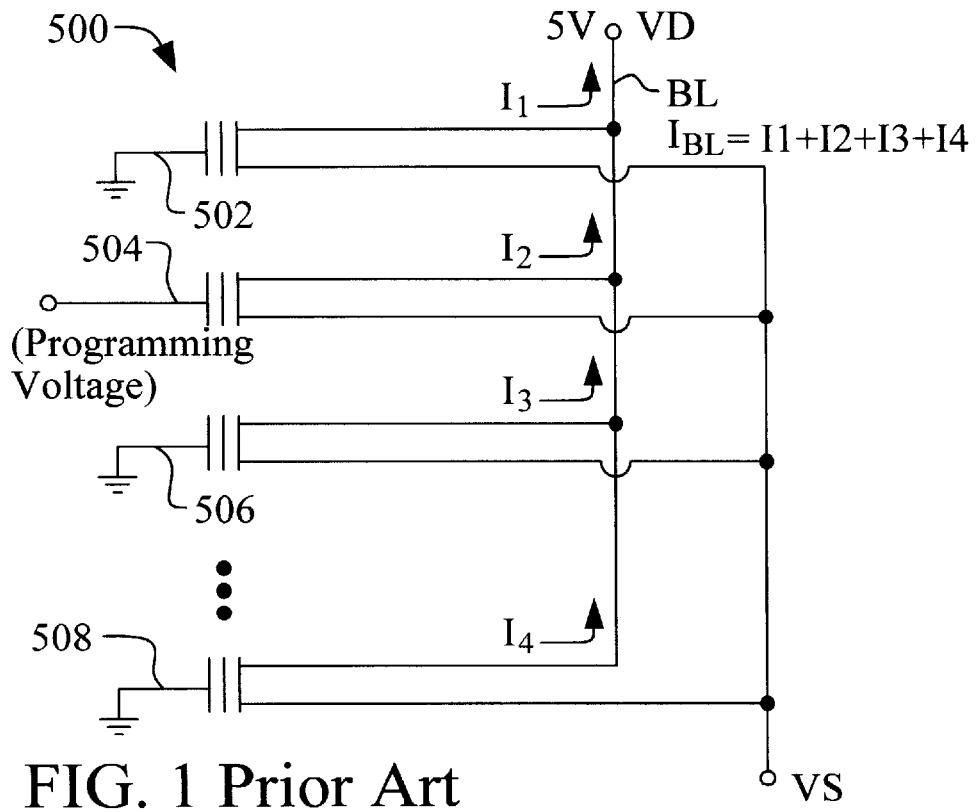
FIG. 1 illustrates a prior art Flash memory array exhibiting a programming failure of an addressed cell due over erased cells in the column.
Figure 2:
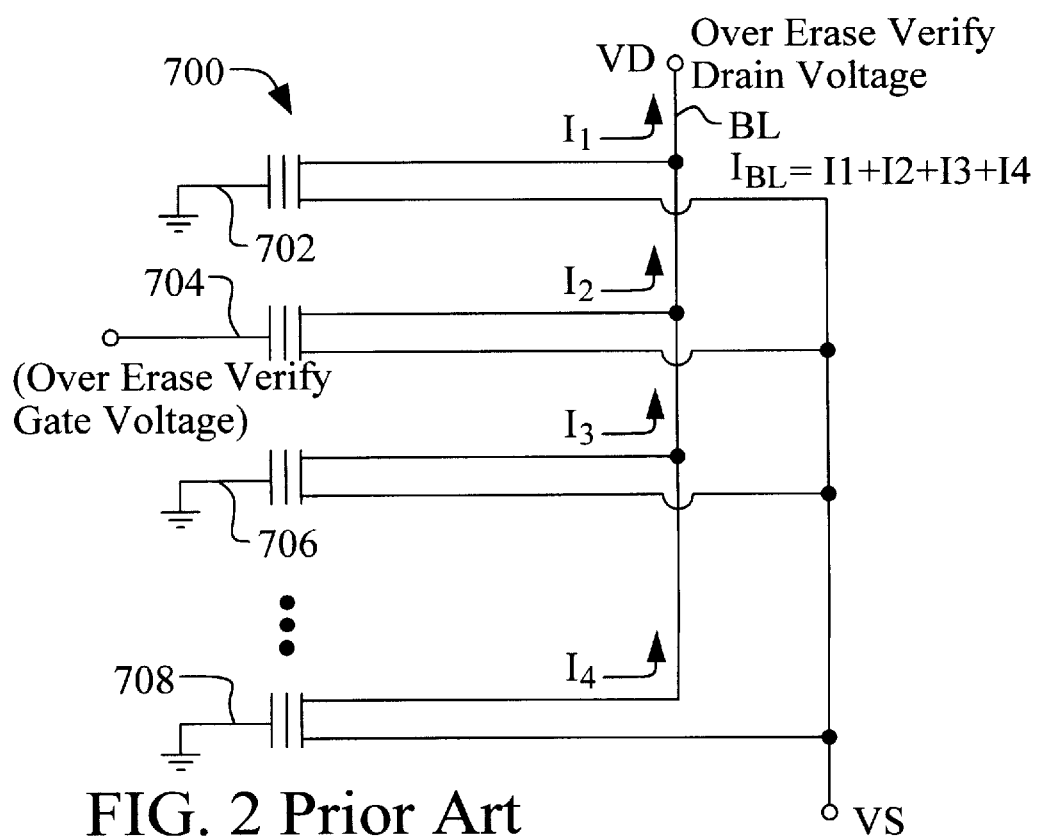
FIG. 2 illustrates a prior art Flash memory array exhibiting a prior art, erase condition detection technique.
Figure 3:
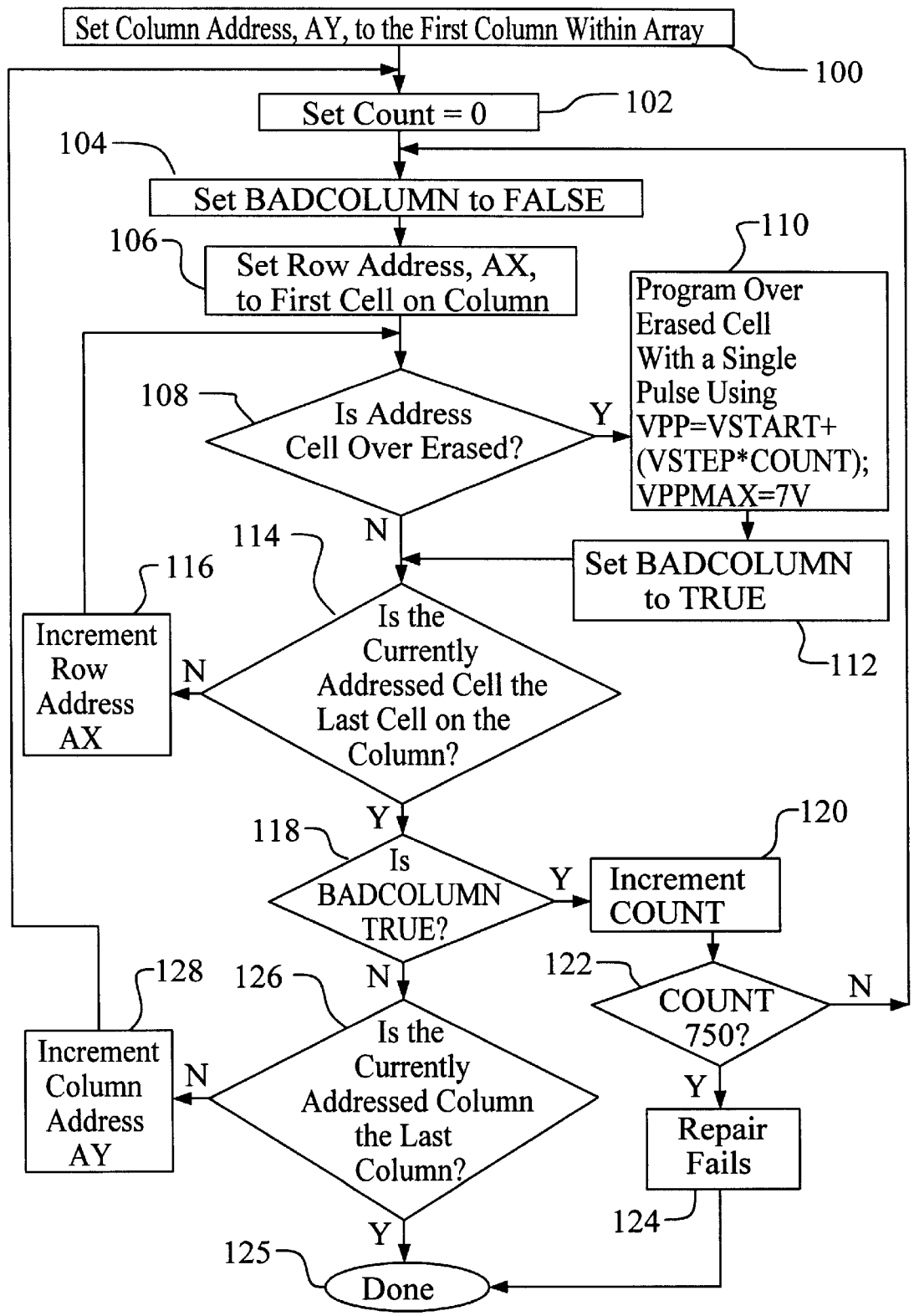
FIG. 3 illustrates an over erase detection and correction method of the prior art.
Figure 4A:
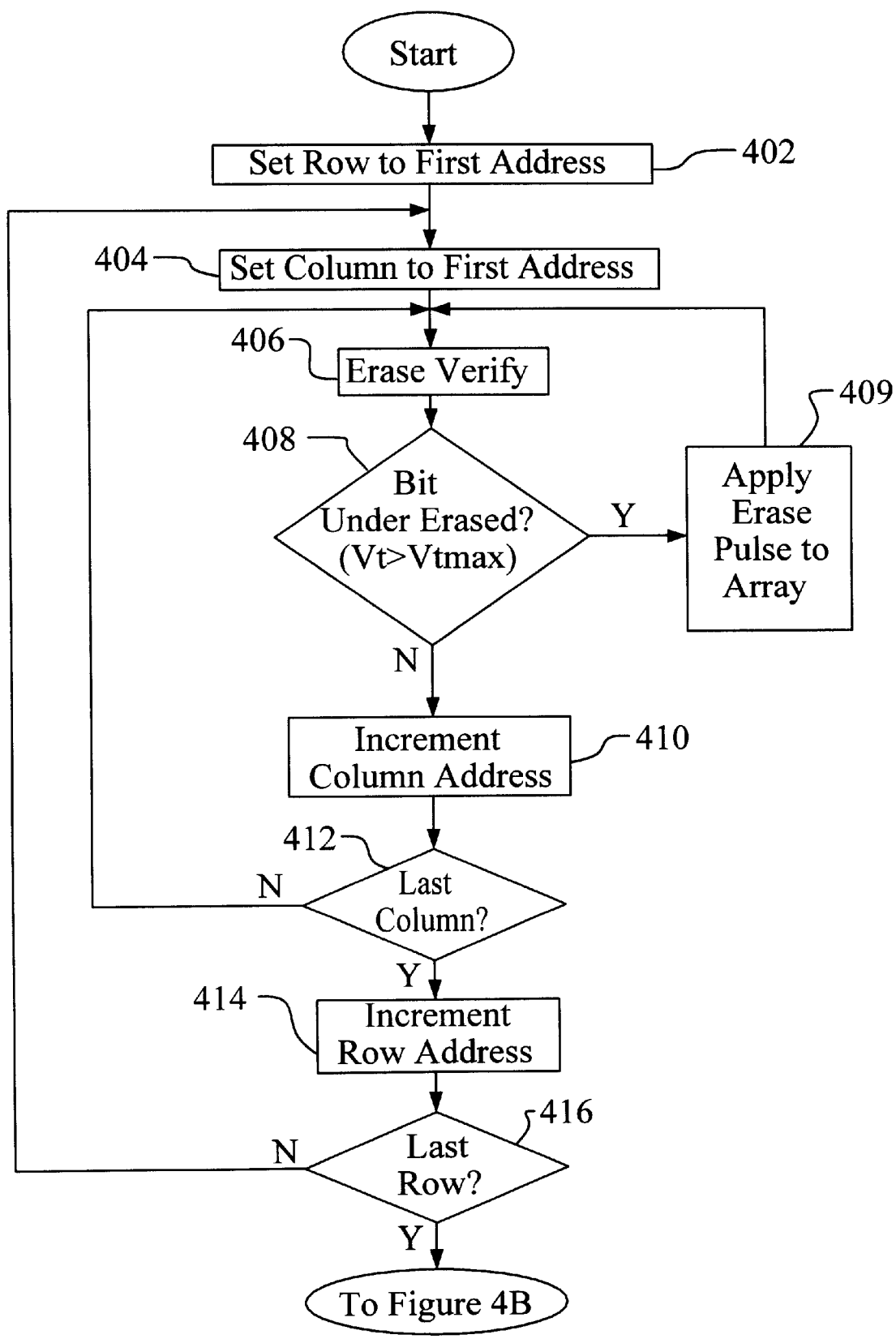
FIGS. 4A through 4C illustrates a second erase and over erase correction method of the prior art based on a bit-by-bit technique.
Figure 4B:
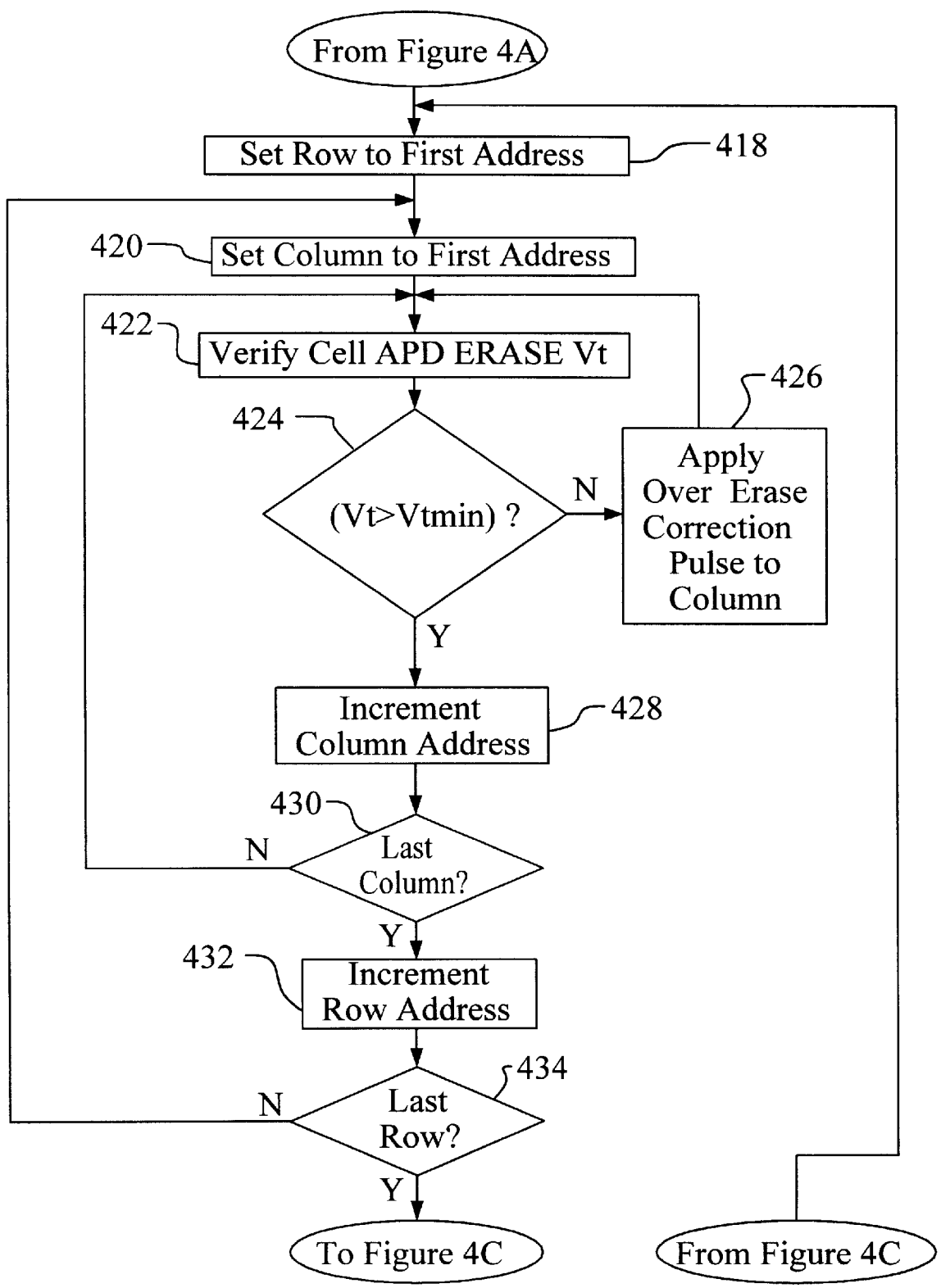
Figure 4C:
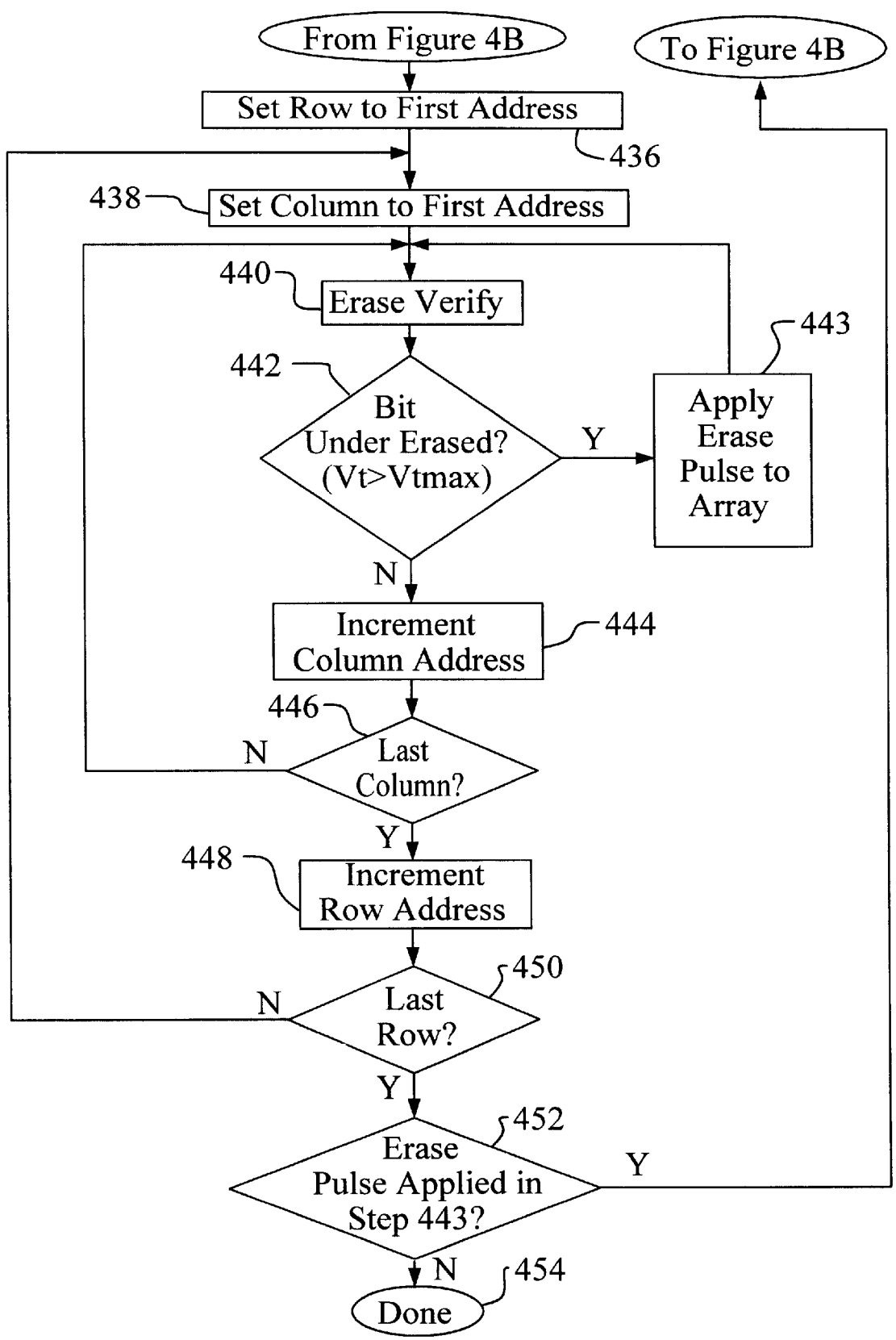
Figure 5:
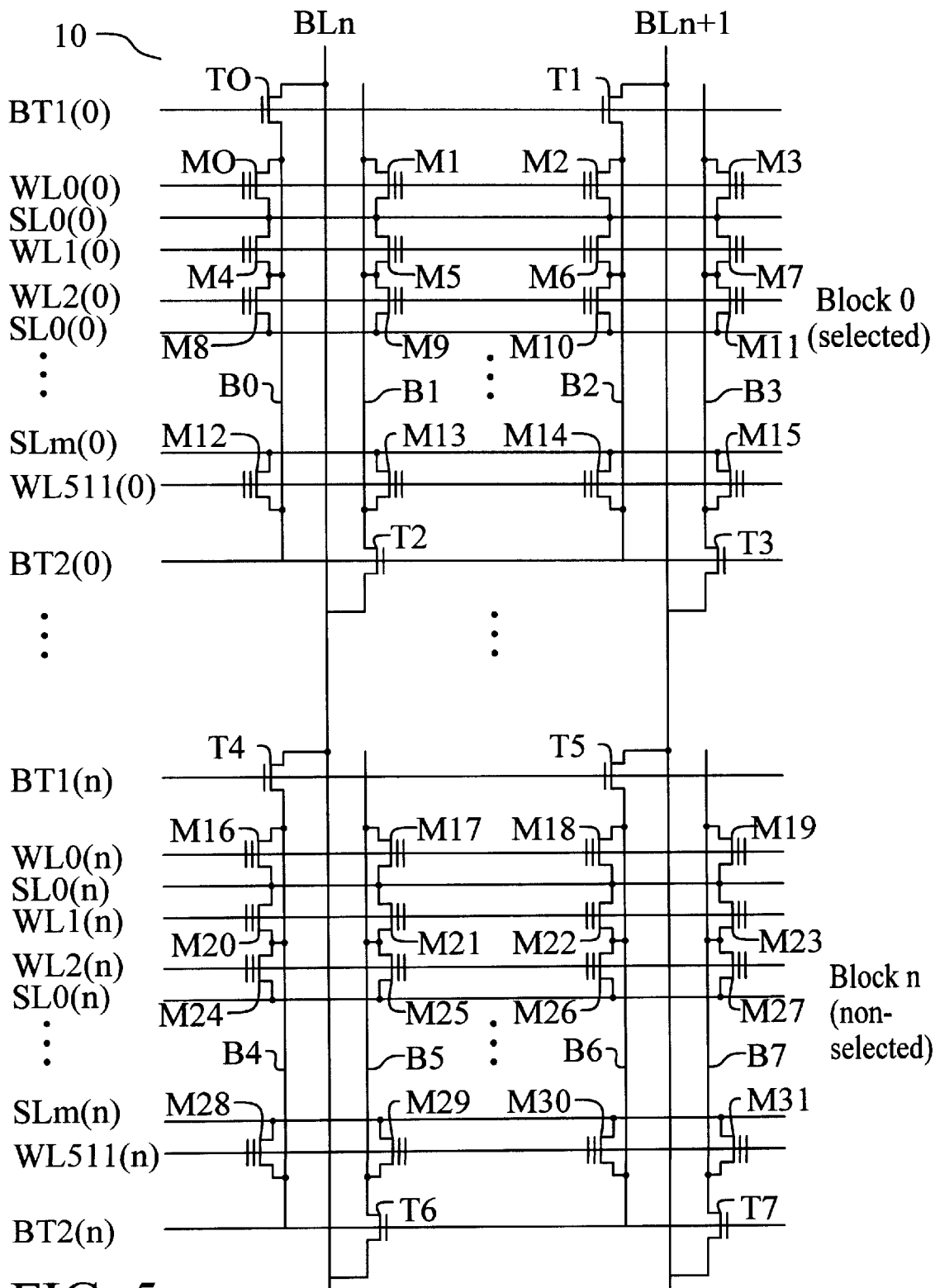
FIG. 5 illustrates an ETOX NOR Flash array on a P-substrate with selected (Block 0) and non-selected (Block n) blocks on which the first embodiment method of the present invention is applied.

Referring now to FIG. 5, a simplified electrical schematic diagram of a Flash EEPROM array 10 is shown. More specifically, an ETOX NOR Flash array on a P-substrate is illustrated. The first embodiment method of erasing, verify, and correcting of the present invention is applied to this type of ETOX NOR Flash array. In an ETOX array, the hot-carrier mechanism is used for programming the memory cells.

The ETOX NOR array has a plurality of cells arranged in a plurality of row, or wordlines (WLs) and columns, or bitlines (BLn, BLn+1). The control gates of cells in a row are all connected to a common wordline. For example, cells M0, M1, M2, and M3, are all connected to the common wordline, WL0(0). Cells in consecutive rows are coupled to the same source line. For example, cells M0 and M4 share the source line, SL0(0).

The ETOX NOR array is divided into blocks. For example, two blocks are shown, Block 0 and Block n. Further, these blocks are subdivided into sub-block's. Each sub-block, or sub-section, comprises cells that share a common source line. Further, each sub-block's source line has its own latch, not shown, which determines the erase inhibit status for that sub-block. Further still, each sub-block has a common power line for the wordlines used in that block so that a single latch can be used to erase inhibit the wordlines for that sub-block. The drain of each cell in a sub-block is connected to sub-block bitline that is then coupled to the global bitline via a bitline select transistor. For example, the sub-block bitline B0 is coupled to the global bitline BLn via the bitline select transistor T0 that is controlled by the bitline select signal BT1(0). Finally, Block 0 is designated as the selected block, and Block n is designated as the non-selected block.

Referring now to FIG. 6, a bias condition table for wordlines, bitlines, and source lines, for the ETOX NOR Flash array of FIG. 5 is illustrated. The bias condition table shows the necessary biases for different operations, such as erase, erase verify, erase inhibit, correction verify, and correction. It is particularly important to point out the three-level voltage scheme for the wordlines. The three-level voltage scheme is used for verification, or checking, of the erasing condition of the cells. The scheme is also used for the correction operation, or any other programming operation, not shown.

For example, the bias table of FIG. 6 shows an erase verify operation where the erase condition of cell M3 of FIG. 5 is under check. The corresponding bitline, BLn+1 is driven to 1 Volt. The corresponding source line, SL0(0) is grounded. Note that the wordline voltages for various cells are driven to one of three levels. First, the wordlines for cells in the non-selected block, Block n, are grounded. This represents the normal off-state gate drive. Second, the wordline voltages of non-selected cells in the selected block, Block 0, such as devices M7 and M11, are all driven to −4 Volts. WL1(0) and WL2(0) are driven to −4 Volts. This wordline voltage, which is herein called a guaranteed off-state voltage, insures that these non-selected cells, that are the same sub-block area and were, therefore subject to the same erasing step as the selected cell, do not interfere with the condition check of M3. It should be understood that other voltage values could be chosen for the guaranteed off-state voltage. Third, the wordline, WL0(0), for the cell under check, M3, is driven to the erase verify test voltage, $V_{ersvfy}$. By using a three-level wordline approach, and more specifically, by driving the non-selected cells in the selected section to the guaranteed off-state voltage, any measurement interference by the over erased cells in the selected section is eliminated.

The three-level scheme is repeated in the correction verify biasing wherein the cell M7 is being checked for an over erase condition. Finally, the three-level scheme is used for the correction operation. In the correction operation, a voltage pulse of value, $V_{corr}$, is applied to correct an over erase condition on cell M7. Note that this usage of three-level scheme, and particularly the application of the guaranteed off-state voltage (−4 Volts) to neighboring cells in the sub-section is useful for eliminating the over loading problem on the bitline supply that was demonstrated in the prior art.

Figure 7A:
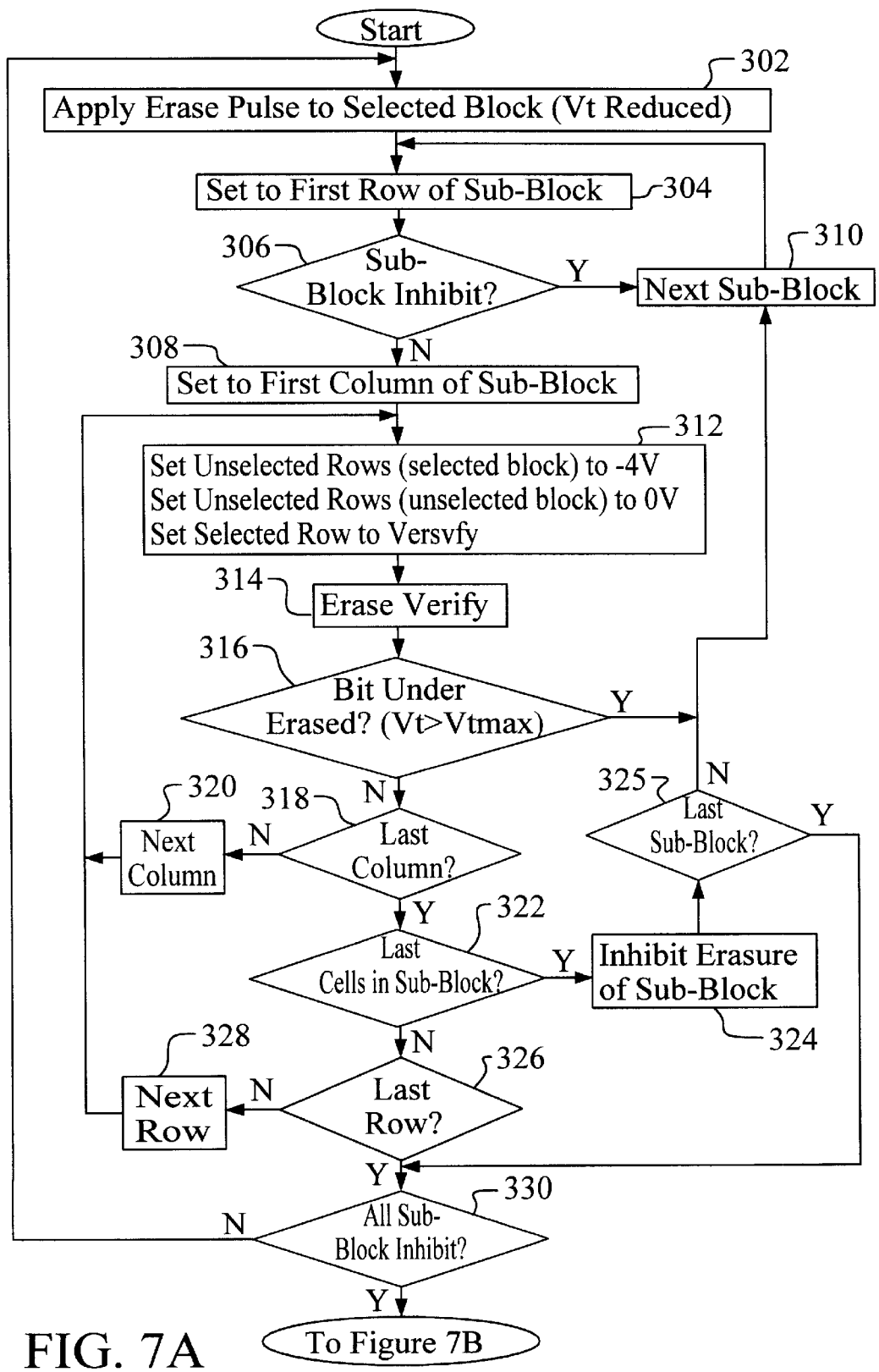
FIGS. 7A through 7B illustrate flow charts of a first preferred embodiment of the Flash memory array erase method of the present invention, as particularly applied to the ETOX NOR array, to exhibit preferred features for erase, bit-by-bit erase verify, sub-block erase inhibit, bit-by-bit over erase verify, and bit-by-bit correction.
Figure 7B:
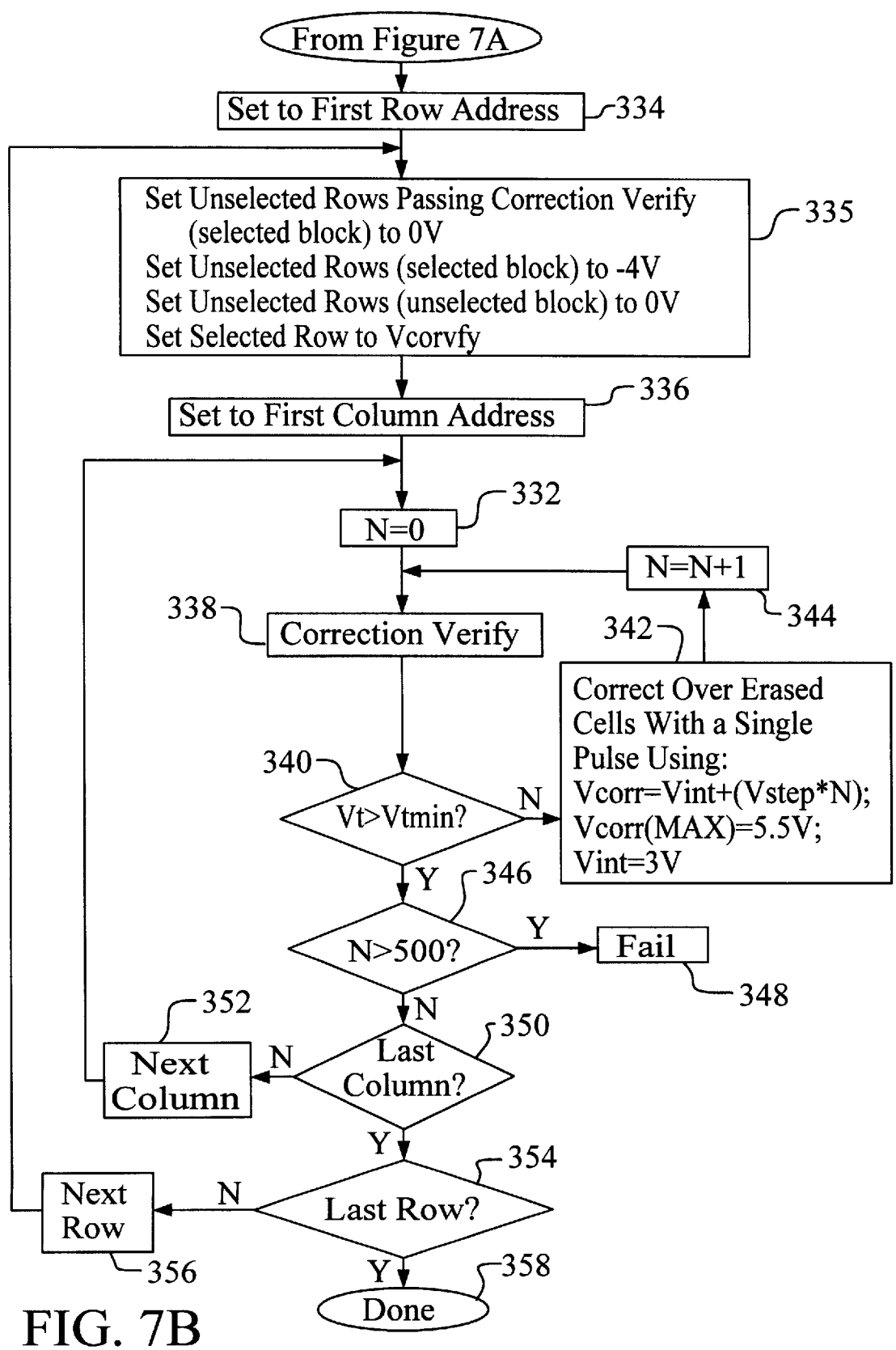

Referring now to FIGS. 7A through 7B, flow charts of a first preferred embodiment of the Flash memory array erase method of the present invention, as particularly applied to the ETOX NOR array, are shown. The methods exhibit preferred features for erase, bit-by-bit erase verify, sub-block erase inhibit, bit-by-bit over erase verify, and bit-by-bit correction.

Referring now particularly to FIG. 7A, methods to erase, erase verify, and under erase correct are shown. Though not shown in FIG. 7A, the Flash memory device is typically pre-programmed to an all "0" state prior to the erase operation. In this way, the method can further guarantee that no over erased cells in the array will interfere with erase detection. However, this is an optional step. The present invention covers both Flash memories requiring pre-programming and those that do not.

As a first step, an erase pulse is applied to a selected section, block, or sub-block of the memory array in step 302. An erased section and non-erased sections of the array are thereby created. Returning to the example biasing of the table of FIG. 5, Block 0 is erased. During this initial erase operation 302, −10 Volts is applied to the rows, WL0(0), WL1(0), WL2(0), through WL511(0). The main bitlines, BLn and BLn+1 are grounded. Since BT1(0) and BT2(0) are both grounded, all the bitline transistors, T0 through T3, are OFF. Therefore, the bitlines of cells in the selected block (Block 0) are left floating. The source lines, SL0(0) and SLm(0) are biased to 5 Volts.

After the initial erasure, the state machine processor sets the row address to the first row of the first sub-block or sub-section of the erase Block 0 in step 304. The status of the sub-block inhibit latch is checked in step 306. At this point in the method, all of the sub-block erase inhibit latches are reset. That is, all of the sub-blocks of the memory array are enabled for future erasing. The first column address is set in step 308 so that the first memory sub-section is selected. The unique three-level wordline scheme is set-up in step 312. The selected row in the erased sub-section, WL0(0) in this case, is biased with the positive pulse, $V_{ersvfy}$. Meanwhile, the rows in the non-selected rows of the erased sub-section are set to the guaranteed off-state voltage of −4 Volts. The rows in the non-erased sections, such as Block n, are biased to ground. The −4 Volts on the non-selected cells of the erased sub-section guarantees that any over erased cells in these locations will not invalidate the under erase check. The selected main bitline, BLn+1, is set at 1 Volt. The non-selected main bitline, BLn, is set to ground. Non-selected bitline select signal BT1(0) is forced to ground, while selected bitline select signal BT2(0) is forced to VDD.

The bitline current is measured in step 314. The selected cell is expected to be ON at a control gate voltage of $V_{ersvfy}$. A bit under erase condition is detected is any bit of the selected cell has a $V_t$ above $V_{tmax}$ in step 316. If all of the bits in the selected cell are below $V_{tmax}$, then the cell passes the under erase check of step 316.

If the cell passes the under erase check of step 316, then next address in the same sub-block is chosen for the erase verify again in step 320. If the last column of the sub-block has been reached in step 318, then the erase inhibit latch for that sub-block is set in step 324. Since the source line of any erase inhibit sub-block is set at 0 Volts during the repeated erase operation of step 302, the cells in the inhibited sub-block are not erased again. This eliminates the risk of over erasure.

If the last sub-block in the block has not been reached in step 325, then the process of testing sub-sequent sub-blocks continues with 310. However, once all the sub-blocks have been checked, as checked by step 330, then another erase pulse is performed in step 302. The process is repeated until all of the sub-blocks in the selected, erased block have been erase inhibited. This indicates that all of the sub-blocks have passed the under erase check.

Referring now to FIG. 7B, the method continues with an over erase condition detection and correction method starting in step 332. In step 332, a correction counter (N) is initialized. The correction counter is used if the correction pulse of step 342 comprises a pulse generator that exhibits an incremental value based on the correction counter value (N). The first row address is again selected in step 334. The three-level wordline voltage scheme is again used for the over erase verification in step 335. First, a positive pulse, $V_{corvfy}$, is transferred to the selected row, in this case WL1(0), of the addressed cells. Second, the non-selected rows in the erased section are biased to the guaranteed off-state voltage of −4 Volts. Third, the non-selected (and non-erased) block, in this case Block n, has wordlines biased to ground. An added constraint of step 335 is that the non-selected rows of the erased block that have already passed the over erase verification are biased to ground. On the first pass, no cells will fit this category. However, as correctly erased cells pass the check, the method biases these control gates to ground to avoid any potential of disturbing the erase value of these cells. The selected main bitline (BLn+1) and the bitline select transistor BT2(0) are biased to 1 Volt and VDD, respectively. The non-selected bitline (BLn), as well as the non-selected bitline transistor BT1(0) are grounded. Note that only the selected bit in the addressed cell is verified. If the $V_t$ of all the bits of the addressed cell is greater than $V_{tmin}$ in step 340, then these cells are considered as properly erased and do not need over erase correction. In this case, the next cell, or next row, is selected in steps 350 and 354 and the process continues until the last cell of the selected block is reached in step 354.

If a bit fails the test of step 340, then this bit is labeled an over erased bit. In this case, a correction voltage is pulsed on this cell in step 342. During the bit-by-bit over erase correction, a positive pulse, $V_{corr}$, is applied to the row of the addressed cell. Referring to the example of FIG. 6 again, the cell receiving correction is M7. In this case, WL1(0) receives the $V_{corr}$ pulse. The non-selected row, WL0(0) in Block 0, is assumed to have already passed the over erase check. Therefore, WL0(0) is grounded. The remaining non-selected rows in the erased block have not been verified and, therefore, are biased to the guaranteed off-state voltage of −4 Volts to prevent any leakage current. All the non-selected rows of Block n are set to ground. In the selected block, the source lines, SL0(0) and SLm(0), and the non-selected bitline selection transistor, BT1(0), are grounded. The selected main bitline, BLn+1, is biased to 5 Volts, while the non-selected bitline is grounded. The selected bitline transistor, BT2(0), is driven to 10 Volts. In this configuration, only the selected, over erased bits on the addressed cell will receive the over erase correction pulse of step 342.

After the cell is corrected, the correction counter is incremented in step 344. The cell is then re-verified in steps 338 and 340. If the cell fails again, it is corrected again. This time, however, the correction pulse peak value is incremented. Preferably, the correction pulse is described by the equation:

$$V_{CORRECTION} = V_{INITIAL} + (V_{STEP} \times COUNTER_{CORRECTION}),$$

where $V_{CORRECTION}$ is the peak value of the pulse, $V_{INITIAL}$ is the peak value of the pulse for the first pass, $V_{STEP}$ is a voltage increment for each pass, and $COUNTER_{CORRECTION}$ is the current value of the correction counter. Each time, the correction magnitude is slightly increased until a maximum value is reached. In the preferred embodiment, the correction value has an initial value of about 3 Volts and a maximum value of about 5.5 Volts. If the correction counter exceeds a maximum value for a particular address in step 346, the process is stopped and the device is labeled as a failed cell in step 348. At the end of the last row of the selected block in step 354, if all of the cells pass the over erase verification and/or correction, then the process is completed. All of the cells have been properly erased and verified for both under erase and over erase conditions.

Figure 8:
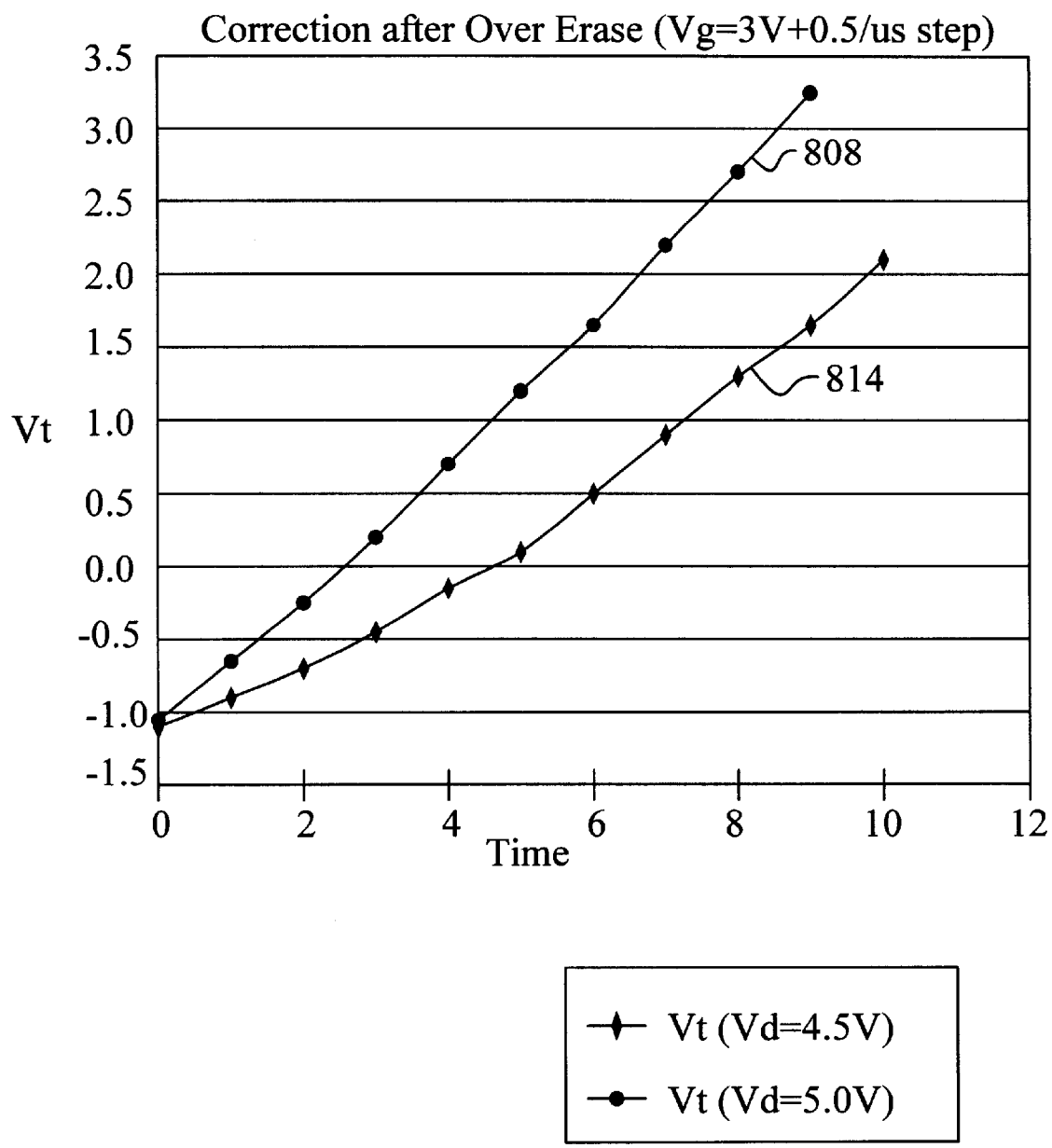
FIG. 8 graphically illustrates the performance of the step-ramped correction voltage pulse for correcting an over erased condition as displayed in the $V_t$ level.

Referring now to FIG. 8, the performance of the step-ramped correction voltage pulse for correcting an over erased condition in the $V_t$ level is displayed. In this case, the correction voltage is stepped up from 3 Volts in increments of 0.5 Volts. The increasing voltage thresholds at $V_D$ values of 4.5 Volts and 5 Volts are shown in 814 and 808 respectively.

Figure 9A:
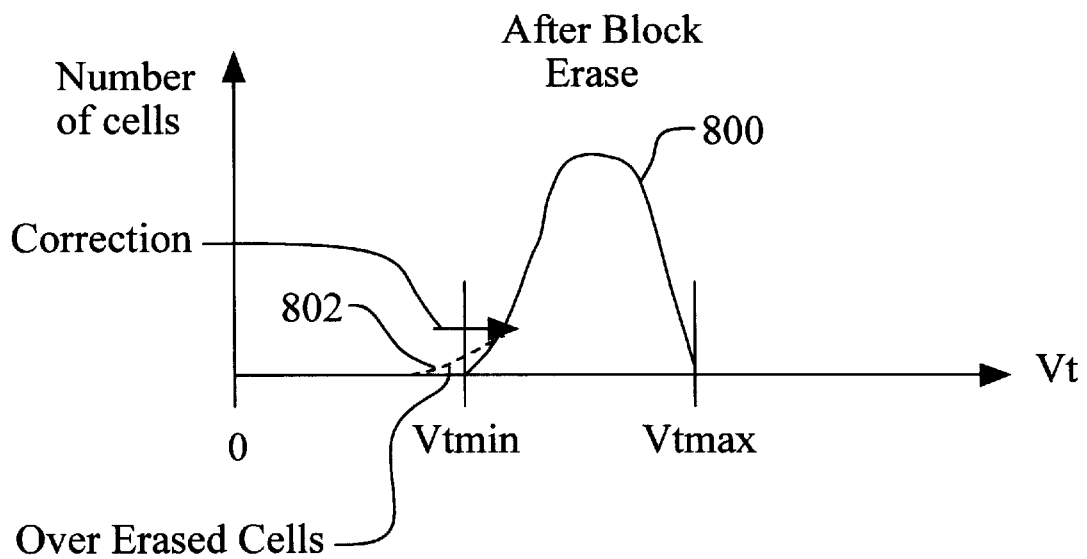
FIG. 9A illustrates the $V_t$ distribution after erasure of a prior art Flash memory device in the prior art.
Figure 9B:
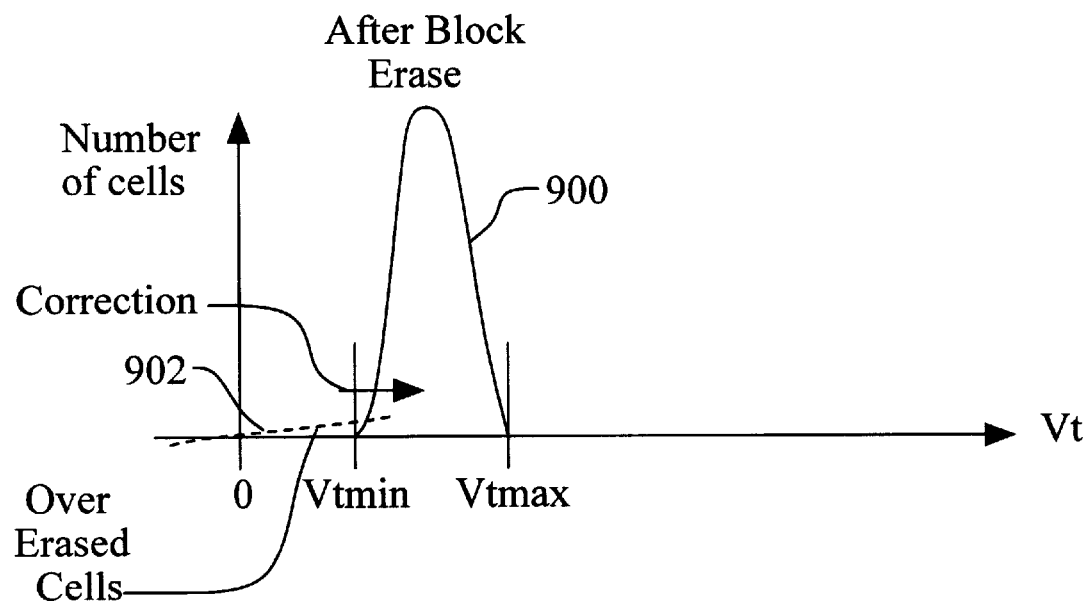
FIG. 9B illustrates the $V_t$ distribution after erasure using the method of the present invention.

Referring now to FIGS. 9A and 9B, the $V_t$ distribution after erasure is shown for the prior art method (FIG. 9A) and the method of the present invention (FIG. 9B). The method of the present invention creates a tighter Vt distribution 900. In addition, over erased cells 902 are greatly reduced after correction.

Figure 10:
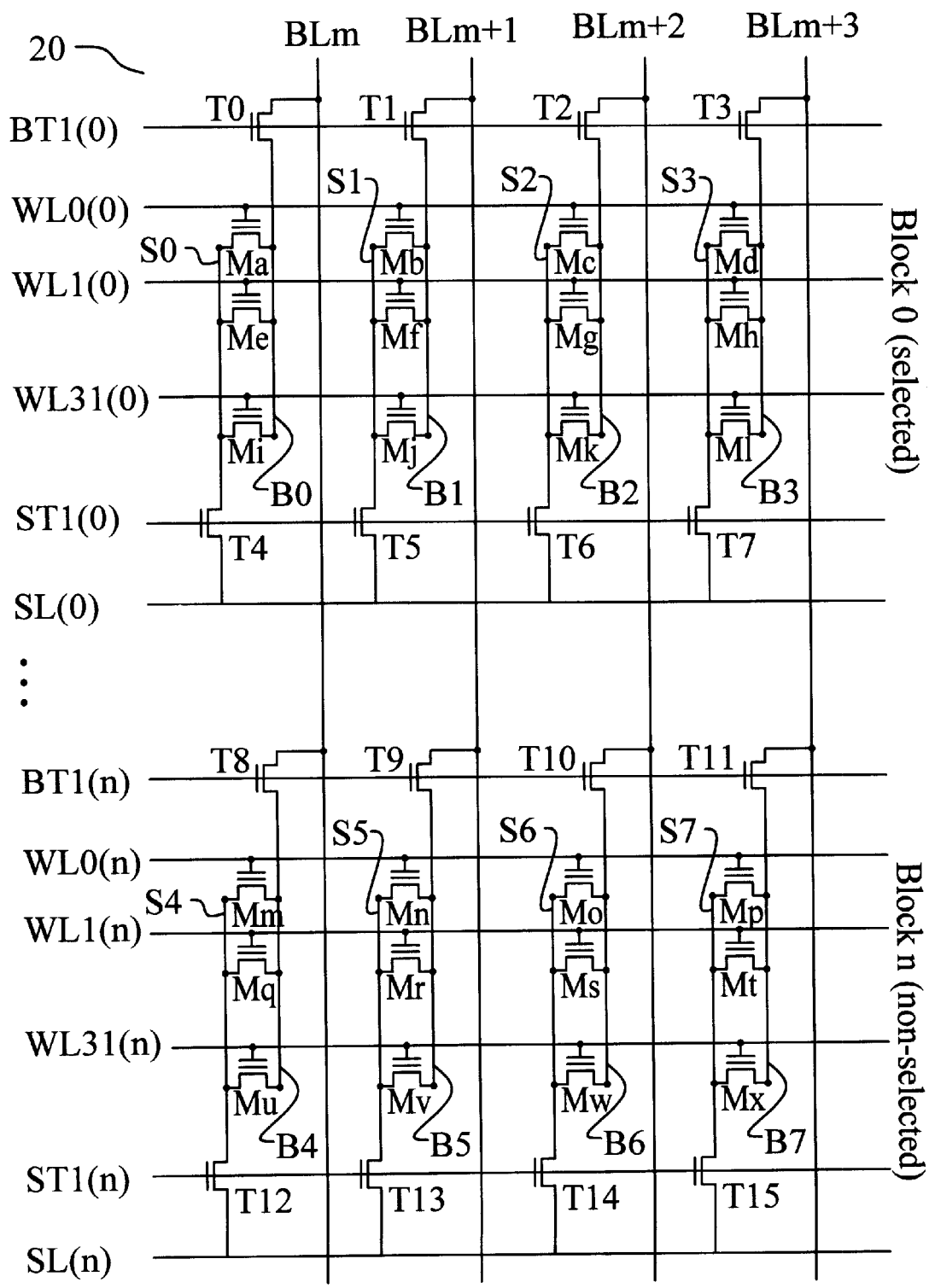
FIG. 10 illustrates an AND Flash array on a P-substrate with selected (Block 0) and non-selected (Block n) blocks on which the second embodiment method of the present invention is applied.

Referring now to FIG. 10, an AND Flash array on a P-substrate is shown. The second embodiment method of the present invention is applied to the AND Flash array. The AND array has a plurality of cells arranged in a plurality of rows, or pages (WLs), and columns, or bitlines (BLm, BLm+1, BLm+2, BLm+3). The control gates of the horizontal cells connect and form a row or page that is coupled to a wordline, such as WL0. The AND array is divided into blocks or sectors, each consisting of one or more pages. Each row or page has its own page latch, not shown, that acts as an erase inhibit indicator for that page. Sources of cells in the same block share one common source line, such as SL0, through the source line select transistors, for example, T4 through T7. Each drain of each cell in the same block is connected to the global main bitlines, such as BLm, by the bitline select transistors, such as BT1(0). Note that the AND Flash memory array uses the Fowler-Nordheim tunneling mechanism for programming.

In FIG. 10, Block 0 is designated as the selected block. Block n is designated as the non-selected block. This is the convention used in the bias operation table for the AND array given in FIG. 11. FIG. 11 provides exemplary bias conditions for wordlines, bitline, and source lines in the AND array during different operations such as erase, erase verify, erase inhibit, correction verify, and correction. Note that, during all operations, in the non-selected block, Block n, all terminals are set to ground except for the main bitlines, such as BLm, that extend into the selected block, Block 0.

Figure 12A:
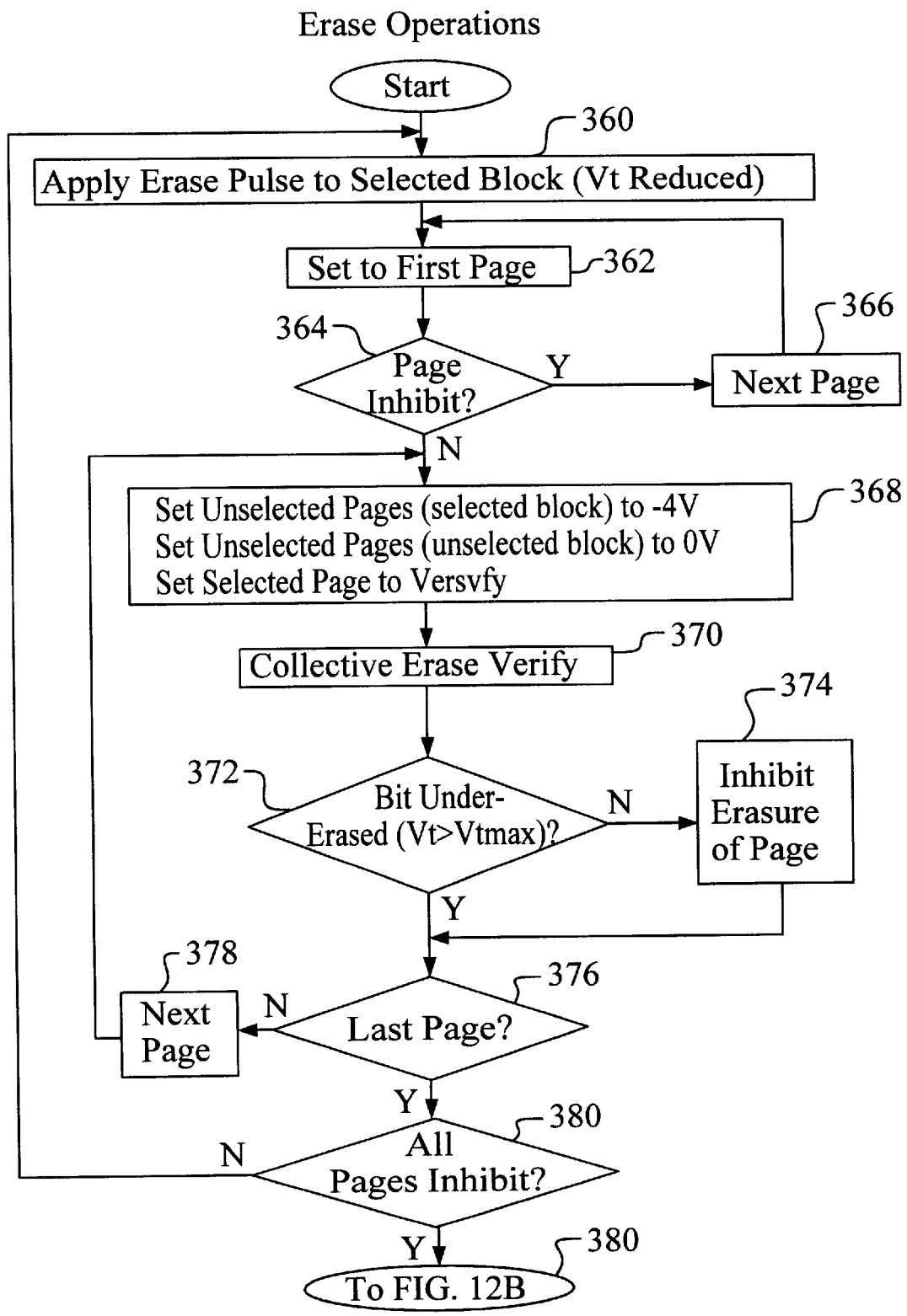
FIGS. 12A through 12B illustrate flow charts of a second preferred embodiment of the Flash memory array erase method of the present invention, as particularly applied to the AND array, to exhibit preferred features for erase, bit-by-bit erase verify, sub-block erase inhibit, bit-by-bit over erase verify, and bit-by-bit correction.
Figure 12B:
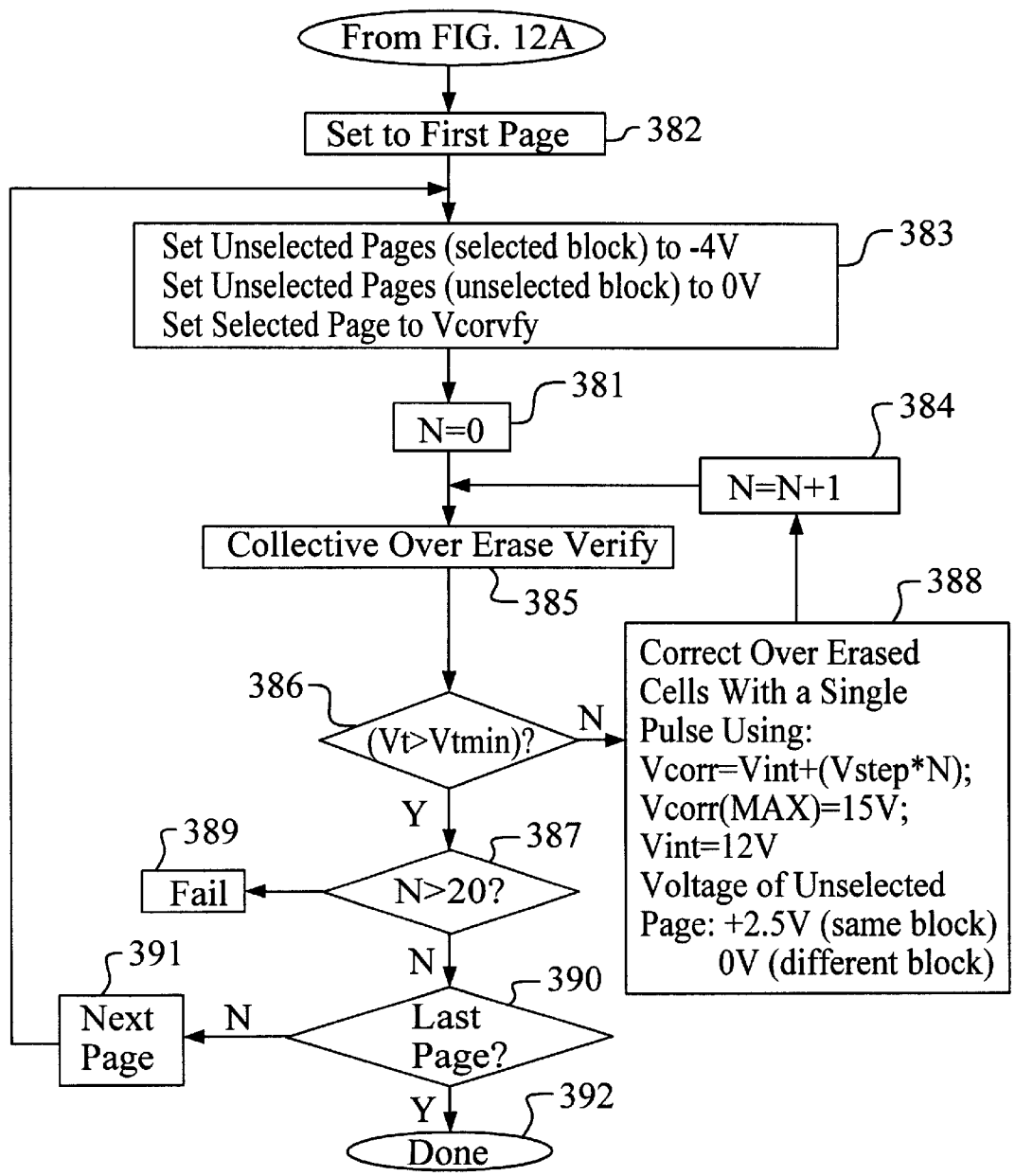

Referring now to FIGS. 12A through 12B, a second preferred embodiment of the Flash memory array erase method of the present invention, as particularly applied to the AND array, is illustrated in flow chart form. Preferred features for erase, bit-by-bit erase verify, sub-block erase inhibit, bit-by-bit over erase verify, and bit-by-bit correction are exhibited. Once again, it is typical for the AND array to be pre-programmed to "0" everywhere prior to erasing. During the initial block erase operation in step 360, the selected block is erased while the non-selected block is not erased. Assuming the selected block is Block 0, this means that −15 Volts and ground are applied to the pages (wordlines) and the main bitlines (BLm, BLm+1, BLm+2, BLm+3), respectively. Meanwhile, the selected source line SL(0) is grounded. Since VDD is applied to turn ON the BT transistors (T0 through T3) and the select line transistors (T4 through T7), the drains and sources of the cells in the selected block are grounded.

After the initial block erasure in step 360, the state machine processor sets the row address to the first page in step 362. The page inhibit latch is then checked in step 364. A page is considered inhibited when the page inhibit latch is reset. Since, initially, all the page latches are set, the addressed page latch is not inhibited on the first pass. Prior to the collective erase verify of step 370, the critical bias conditions are set in step 368. Once again, the novel three-level scheme is used to prevent the problems of the prior art. Particularly, first, the selected page, in this case, WL0(0), is biased with a positive pulse, $V_{ersvfy}$. Second, the non-erased pages in the non-selected block are biased to the normal off-state voltage of ground. Third, the non-selected pages in the erased block are biased to the guaranteed off-state voltage of about −4 Volts. Once again, the guaranteed off-state voltage on the non-selected pages, such as WL1(0), will shut off any over erased cells that could cause false under erase detection during step 372. However, the normal off-state bias on the non-selected, Block n cells is sufficient since these cells were not erased.

Since a collective erase verify is performed in step 370, all the main bitlines are set to 1 Volts, and BT1(0) is set to VDD to turn ON transistors T0 through T3. The selected source line, SL(0), is grounded, and the select transistors T4 through T7 are turned ON by the applied VDD on ST1(0). In step 372, if $V_t$ of any bit in the selected page is above $V_{tmax}$, then the page is considered under erased. The processor immediately jumps to the next address of the next page in step 378 and the verification continues. If the $V_t$ of all of the bits in the selected page is below $V_{tmax}$, then the page passes the under erase check, and its page latch is set to erase inhibit in step 374.

Erase verify continues until the last page of the selected block is completed in step 376. If not all of the pages are erase inhibited in step 380, then another erase pulse is applied in step 360. Only those pages that are not erase inhibited will receive the erase pulse. Since bits that were not under erased do not receive additional erase pulses, the risk of over erase is limited. When all the pages of the selected block pass the under erase check of step 380, the processor begins the over erase detection and correction method of FIG. 12B.

Referring again to FIG. 12B, a correction counter (N) is initialized in step 381. The processor then moves to the first page of the selected block. The novel, three-level wordline scheme is again used as the configuration, in step 383, for the over erase verify of step 385. In particular, first, a positive pulse, Vcorvfy, is applied on the selected page, for example, WL0(0) of Block 0. Second, the guaranteed off-state voltage, −4 Volts, is transferred to the non-selected pages, such as WL1(0) through WL31(0), of Block 0. All over erased, but non-selected, cells in the selected block are thereby turned OFF. Third, the pages of the non-selected block are grounded.

Because this is a collective verification, all main bitlines in the selected block are selected and set to 1 Volt. If the $V_t$ of all of the bits in the addressed page is more than $V_{tmin}$ in step 386, then these bits in the addressed page are considered as properly erased bits and do not need over erase correction. In this case, the next page will be selected for over erase verify in step 391. The process will continue until the last page of the selected block is passed in step 390.

If the $V_t$ of any bit in the page is found to be less than $V_{tmin}$ in step 386, then it is rendered as an over erased bit in this page. Only the over erased bit will receive the correction pulse in step 388. During the over erase correction, those bits that have passed the over erase verify will be inhibited from receiving correction. The positive pulse, $V_{corr}$, is applied to the selected over erased page (WL0). Meanwhile the non-selected pages are set at 2.5 Volts to thereby reduce disturbance between the wordlines and the bitlines and sources. The selected main bitlines (BLm, BLm+2) for the over erased bits are set to ground. The non-selected main bitlines are set to 5 Volts. BT1(0) is set at 10 Volts to turn ON the bitline transistors, T0 through T1. ST1(0) is set at ground to turn OFF T4 through T7 and thereby float all the individual source lines (S0 through S3).

The over erase correction pulse peak level is incremented each time the correction is performed. The correction pulse is preferably given by the equation:

$$V_{CORRECTION} = V_{INITIAL} + (V_{STEP} \times COUNTER_{CORRECTION})$$

where $V_{CORRECTION}$ is the peak value of the pulse, $V_{INITIAL}$ is the peak value of the pulse for the first pass, $V_{STEP}$ is a voltage increment for each pass, and $COUNTER_{CORRECTION}$ is the current value of the correction counter. Each time, the correction magnitude is slightly increased until a maximum value is reached. In the preferred embodiment, the correction value has an initial value of about 12 Volts and a maximum value of about 15 Volts. If the correction counter exceeds a maximum value for a particular page in step 387, the process is stopped and the device is labeled as a failed cell in step 389. At the last page of the selected block, if all the pages pass the over erase verify and/or correction, then they have been properly erased and the process completes successfully.

The present invention provides an effective method to erase a memory array. A method to check the erase condition of memory cells of a memory array is achieved. A novel, three voltage level wordline, or control gate, scheme is used to eliminate errors in detection due to over erased cells. A guaranteed off-state voltage is used to guarantee that even over erased cells are in the off-state during a bit line check. A method to verify and correct under erased memory cells in a memory array is achieved. Cells are selectively re-erased if an under erase condition is detected. A method to detect and correct over erased memory cells in a memory array is achieved. Cells are selectively pulsed with a correction voltage if an over erase condition is detected.

As shown in the preferred embodiments, the novel method for erasing a Flash memory device provides an effective alternative to the prior art.

While the invention has been particularly shown and described with reference to the preferred embodiments thereof, it will be understood by those skilled in the art that various changes in form and details may be made without departing from the spirit and scope of the invention.

What is claimed is:

1. A method to test an erase condition of memory cells in a memory array device, said method comprising:

altering the erase condition of a section of said memory array device to form an erased section and non-erased sections;

forcing control gates of said memory cells in said non-erased sections to a normal off-state voltage sufficient to turn off erased cells;

forcing control gates of said memory cells in non-selected subsections of said erased section to a guaranteed off-state voltage that will turn off erased cells including those that are over erased;

forcing control gates of said memory cells in a selected subsection of said erased section to a check voltage;

thereafter measuring bitline current of said selected subsection of said erased section to determine erase condition of said selected subsection of said erased section.

2. The method according to claim 1 wherein said erase condition comprises an under erase condition.

3. The method according to claim 1 wherein said erase condition comprises an over erase condition.

4. The method according to claim 1 wherein said memory array device comprises memory cells selected from the group consisting of: OR array, NOR array, ETOX NOR array, and AND array.

5. The method according to claim 1 further comprising pre-programming said memory array device prior to said step of altering the erase condition of a section of said memory array device.

6. The method according to claim 1 further comprising correcting erase condition of said selected subsection of said erase section if said erase condition comprises one of the group consisting of: under erase condition and over erase condition.

7. The method according to claim 1 wherein said normal off-state voltage comprises a value of about 0 Volts and wherein said guaranteed off-state voltage comprises a value of about −4 Volts.

8. A method to detect and correct an under erase condition in memory cells in a memory array device, said method comprising:

erasing a section of said memory array device to form an erased section and non-erased sections;

enabling subsequent erasing of all subsections of said erased section;

setting a starting memory address and thereby selecting a subsection of said erased section;

thereafter detecting under erased memory cells in said selected subsection of said erased section wherein said detecting comprises:

forcing control gates of said memory cells in said non-erased sections to a normal off-state voltage sufficient to turn off erased cells;

forcing control gates of said memory cells in non-selected subsections of said erased section to a guaranteed off-state voltage that will turn off erased cells including those that are over erased;

forcing control gates of said memory cells in a selected subsection of said erased section to an under erase check voltage;

thereafter measuring bitline current of said selected subsection of said erased section to determine said under erase condition of said selected subsection of said erase section and disabling subsequent erasing of said selected subsection of said erased section if said under erase condition does not exist;

thereafter incrementing to next said memory address and thereby selecting a new selected subsection of said erased section; and repeating said steps for said detecting under erased memory cells until every said subsection of said erased section is detected; and thereafter, correcting said under erased cell by erasing said subsections of said erased section wherein said subsequent erasing remains enabled.

9. The method according to claim 8 wherein said memory array device comprises memory cells selected from the group consisting of: OR array, NOR array, ETOX NOR array, and AND array.

10. The method according to claim 8 further comprising pre-programming said memory array device prior to said step of erasing a section of said memory array device to form an erased section and non-erased sections.

11. The method according to claim 8 wherein said normal off-state voltage comprises a value of about 0 Volts and wherein said guaranteed off-state voltage comprises a value of about −4 Volts.

12. The method according to claim 8 further comprising repeating steps of said method until erasing is disabled for every subsection of said erased section, said repeating steps comprising:
  setting a starting memory address and thereby selecting a subsection of said erased section;
  thereafter detecting under erased memory cells in said selected subsection of said erased section; and
  thereafter, correcting said under erased cell by erasing said subsections of said erased section wherein said subsequent erasing remains enabled.

13. A method to detect and correct an over erase condition in memory cells in a memory array device, said method comprising:
  erasing a section of said memory array device to form an erased section and non-erased sections;
  setting a starting memory address and thereby selecting a subsection of said erased section; and
  thereafter detecting and correcting over erased memory cells in said selected subsection of said erased section wherein said detecting and correcting comprises:
    forcing control gates of said memory cells in said non-erased sections to a normal off-state voltage sufficient to turn off erased cells;
    forcing control gates of said memory cells in non-selected subsections of said erased section to a guaranteed off-state voltage that will turn off erased cells including those that are over erased;
    forcing control gates of said memory cells in a selected subsection of said erased section to an over erased check voltage;
    thereafter measuring bitline current of said selected subsection of said erased section to determine said over erase condition of said selected subsection of said erase section and pulsing a correction voltage on control gates of said memory cells of said selected subsection of said erased section if an over erase condition exists;
    thereafter incrementing to next said memory address and thereby selecting a new selected subsection of said erased section; and
    thereafter repeating said steps until every said subsection of said erased section is over erase detected and corrected.

14. The method according to claim 13 wherein said memory array device comprises memory cells selected from the group consisting of: OR array, NOR array, ETOX NOR array, and AND array.

15. The method according to claim 13 further comprising pre-programming said memory array device prior to said step of erasing a section of said memory array device.

16. The method according to claim 13 wherein said normal off-state voltage comprises a value of about 0 Volts and wherein said guaranteed off-state voltage comprises a value of about −4 Volts.

17. The method according to claim 13 further comprising:
  initializing a correction counter prior to said step of detecting and correcting over erased memory cells;
  incrementing said correction counter for each occurrence of said pulsing a correction voltage on control gates; and
  failing said selected subsection if said correction counter exceeds a maximum value.

18. The method according to claim 13 wherein said pulsing a correction voltage comprises a correction voltage value given by:

$$V_{CORRECTION} = V_{INITIAL} + (V_{STEP} \times \text{COUNTER}_{CORRECTION})$$

wherein said $V_{CORRECTION}$ is the peak value of said pulsing, wherein said $V_{INITIAL}$ is the peak value of said pulsing for the first pass, wherein said $V_{STEP}$ is a voltage increment for each pass, and wherein said $\text{COUNTER}_{CORRECTION}$ is the value of said correction counter.

19. A method to erase memory cells in a memory array device, including detection and correction of under erase and detection and correction of over erase, said method comprising:
  erasing a section of said memory array device to form an erased section and non-erased sections;
  enabling subsequent erasing of all subsections of said erased section;
  setting a starting memory address and thereby selecting a subsection of said erased section;
  thereafter detecting under erased memory cells in said selected subsection of said erased section wherein said detecting comprises:
    forcing control gates of said memory cells in said non-erased sections to a normal off-state voltage sufficient to turn off erased cells;
    forcing control gates of said memory cells in non-selected subsections of said erased section to a guaranteed off-state voltage that will turn off erased cells including those that are over erased;
    forcing control gates of said memory cells in a selected subsection of said erased section to an under erased check voltage;
    thereafter measuring bitline current of said selected subsection of said erased section to determine said under erase condition of said selected subsection of said erase section and disabling subsequent erasing of said selected subsection of said erased section if said under erase condition does not exist;
    thereafter incrementing to next said memory address and thereby selecting a new selected subsection of said erased section; and
    thereafter repeating said steps until every said subsection of said erased section is detected;
  thereafter, correcting said under erased cell by erasing said subsections of said erased section wherein said subsequent erasing remains enabled;
  thereafter setting a starting memory address and thereby selecting a subsection of said erased section; and
  thereafter detecting and correcting over erased memory cells in said selected subsection of said erased section wherein said detecting and correcting comprises:

forcing control gates of said memory cells in said non-erased sections to a normal off-state voltage sufficient to turn off erased cells;

forcing control gates of said memory cells in non-selected subsections of said erased section to a guaranteed off-state voltage that will turn off erased cells including those that are over erased;

forcing control gates of said memory cells in a selected subsection of said erased section to an over erased check voltage;

thereafter measuring bitline current of said selected subsection of said erased section to determine said over erase condition of said selected subsection of said erase section and pulsing a correction voltage on control gates of said memory cells of said selected subsection of said erased section if an over erase condition exists;

thereafter incrementing to next said memory address and thereby selecting a new selected subsection of said erased section; and thereafter repeating said steps until every said subsection of said erased section is detected and corrected.

20. The method according to claim 19 wherein said memory array device comprises memory cells selected from the group consisting of: OR array, NOR array, ETOX NOR array, and AND array.

21. The method according to claim 19 further comprising pre-programming said memory array device prior to said step of erasing a section of said device to form an erased section and non-erased sections.

22. The method according to claim 19 wherein said normal off-state voltage comprises a value of about 0 Volts and wherein said guaranteed off-state voltage comprises a value of about −4 Volts.

23. The method according to claim 19 further comprising repeating steps of said method until erasing is disabled for every subsection of said erased section, said repeating steps comprising:

setting a starting memory address and thereby selecting a subsection of said erased section;

thereafter detecting under erased memory cells in said selected subsection of said erased section; and thereafter, correcting said under erased cell by erasing said subsections of said erased section wherein said subsequent erasing remains enabled.

24. The method according to claim 19 further comprising:

initializing a correction counter prior to said step of detecting and correcting over erased memory cells;

incrementing said correction counter for each occurrence of said pulsing a correction voltage on control gates; and failing said selected subsection if said correction counter exceeds a maximum value.

25. The method according to claim 19 wherein said pulsing a correction voltage comprises a correction voltage value given by:

$$V_{CORRECTION} = V_{INITIAL} + (V_{STEP} \times COUNTER_{CORRECTION})$$

wherein said $V_{CORRECTION}$ is the peak value of said pulsing, wherein said $V_{INITIAL}$ is the peak value of said pulsing for the first pass, wherein said $V_{STEP}$ is a voltage increment for each pass, and wherein said $COUNTER_{CORRECTION}$ is the value of said correction counter.

* * * * *